(12) United States Patent
Yang et al.

(10) Patent No.: US 8,901,205 B2
(45) Date of Patent: Dec. 2, 2014

(54) ELECTROMAGNETIC WAVE-ABSORBING MATERIAL

(75) Inventors: Cheng-Chien Yang, Taoyuan County (TW); Kuo-Hui Wu, Taoyuan County (TW)

(73) Assignee: Chung-Shan Institute of Science and Technology, Armaments, Bureau, Ministry of National Defense, Taoyuan County (TW)

( * ) Notice: Subject to any disclaimer, the term of this patent is extended or adjusted under 35 U.S.C. 154(b) by 312 days.

(21) Appl. No.: 13/226,440

(22) Filed: Sep. 6, 2011

(65) Prior Publication Data
US 2013/0056673 A1 Mar. 7, 2013

(51) Int. Cl.
| | | |
|---|---|---|
| *G21F 1/10* | (2006.01) | |
| *G21K 1/10* | (2006.01) | |
| *H01F 1/26* | (2006.01) | |
| *B27N 3/18* | (2006.01) | |
| *B29C 51/00* | (2006.01) | |
| *H05K 9/00* | (2006.01) | |
| *H01F 1/113* | (2006.01) | |
| *B29C 39/00* | (2006.01) | |
| *H01F 1/10* | (2006.01) | |
| *B29K 505/00* | (2006.01) | |

(52) U.S. Cl.
CPC .............. *H05K 9/0075* (2013.01); *H01F 1/113* (2013.01); *B29C 39/003* (2013.01); *H01F 1/10* (2013.01); *B29K 2505/00* (2013.01); *B29K 2995/0003* (2013.01)
USPC .......................... 523/137; 252/62.54; 264/319

(58) Field of Classification Search
CPC .................................. B29C 39/38; H01F 1/26
USPC ......................................................... 523/137
See application file for complete search history.

(56) References Cited

FOREIGN PATENT DOCUMENTS

TW 201249896 A * 12/2012 ............. C08G 73/02

OTHER PUBLICATIONS

Yang et al., "Infrared and microwave absorbing properties of BaTiO3/polyaniline and BaFe12O19/polyaniline composites", Composites Science and Technology, published Nov. 26, 2009, vol. 70, p. 466-471.*
Yange et al., "Synthesis, infrared and microwave absorbing properties of (BaFe12O19+BaTiO3)/polyaniline composite", Journal of Magnetism and Magnetic Materials, published Dec. 1, 2010, vol. 323, p. 933-938.*
Yang et al., TW 201249896 A Derwent Abstract, 2013.*
Mali et al., "Structural characterization of nano-crystalline BaFe12O19 powders synthesized by sol-gel combustion route", Scripta Materialia, published Jul. 25, 2005, vol. 53, p. 1065-1070.*
Wang et al., "Two-step Sintering of Ceramics with Constant Grain-Size, II: BaTiO3 and Ni—Cu—Zn Ferrite", Journal of the American Ceramic Society, published Sep. 28, 2005, vol. 89, p. 438-443.*
Yang et al., "Synthesis, infrared and microwave absorbing properties of (BaFe12O19+BaTiO3)/polyaniline composite", Journal of Magnetism and Magnetic Materials, published Dec. 1, 2010, vol. 323, p. 933-938.*

* cited by examiner

*Primary Examiner* — Peter F Godenschwager
*Assistant Examiner* — David Karst
(74) *Attorney, Agent, or Firm* — Jackson IPG PLLC

(57) ABSTRACT

Disclosed is an electromagnetic wave-absorbing composite. To make the electromagnetic wave-absorbing composite, barium ferrite ($BaFe_{12}O_{19}$) and barium titanate ($BaTiO_3$) are added into aniline during polymerization of the aniline. Thus, a core-shell structure is formed. The core-shell structure includes a magnetic/dielectric core and a conductive shell for covering the magnetic/dielectric core.

5 Claims, 6 Drawing Sheets

US 8,901,205 B2

ELECTROMAGNETIC WAVE-ABSORBING MATERIAL

BACKGROUND OF INVENTION

1. Field of Invention

The present invention relates to a composite for absorbing electromagnetic waves and, more particularly, to a method for making a composite for absorbing electromagnetic waves.

2. Related Prior Art

Current microwave-absorbing materials include ferrites, carbon black, metal powder, poly-crystal fibers and conductive polymers. A single microwave-absorbing material absorbs a limited frequency band. Moreover, ferrite-based microwave-absorbing materials possess high densities and are not suitable for use in an aircraft. Hence, several mediums each useful in absorbing a frequency band can be mixed with one another to provide a microwave-absorbing composite so that the microwave-absorbing composite is useful in absorbing a wide frequency band.

To make a microwave-absorbing composite with a low density, an organic polymer which possesses a low density may be used as a matrix while several inorganic microwave-absorbing materials may be used as objects. For including conjugated electrons, conductive polymers possess good microwave-absorbing properties. Microwave-absorbing materials of microwave-absorbing composites include ferrites, carbon black, metal powder, poly-crystal fibers and conductive polymers. The microwave-absorbing materials are mixed with adhesives at various ratios to adjust parameters of the microwave-absorbing composites. For example, there have been devised various microwave-absorbing materials, double-layer structure magnetic mediums, ferroelectric/ferromagnetic composites, Ag/ferrite composites, $Fe_3O_4$/graphite composites and ferrite/polymer composites.

Disclosed in Taiwanese Patent No. 469283 is a process for making a dielectric electromagnetic wave-absorbing composite. Resin is mixed with carbon black and ground by a high-speed grinder operated at 3000 to 6000 rpm. The resin/carbon black mixture is further mixed with carbon powder, conductive fibers and hollow balls, thus providing slurry with a high density. The slurry is stirred by a low-speed, high-viscosity blender operated at 300 to 600 rpm. Finally, the slurry is coated on a sheet. The process and related equipment are complicated. Moreover, the conductive fillers are made of synthetic chemical compounds, and are not friendly for the environment.

Disclosed in Taiwanese Patent No. 567643 is a Salbury Screen-type electromagnetic wave-absorbing composite consisting of two materials. The first material is an electrically homogenous consumable material while the second material is a material with a low dielectric constant. The first and second materials are overlapped. This process is more complicated than a process for making a single electromagnetic wave-absorbing material.

Disclosed in U.S. Pat. No. 6,465,098 B2 is carbon fibers made by vapor deposition. Although only small amounts of carbon black and carbon fibers are used, the conductive fillers are made of synthetic chemical compounds, and are not friendly for the environment.

Disclosed in Taiwanese Patent No. 566077 is an electromagnetic wave-absorbing composite including 5 wt % to 50 wt % of multi-tier, hollow carbon balls and 95 wt % to 50 wt % of resin. The carbon balls are made of synthetic chemical compounds, and are not friendly to the environment.

The present invention is therefore intended to obviate or at least alleviate the problems encountered in prior art.

SUMMARY OF INVENTION

It is an objective of the present invention to provide an electromagnetic wave-absorbing composite.

To achieve the foregoing objective, barium ferrite ($BaFe_{12}O_{19}$) and barium titanate ($BaTiO_3$) are added into aniline during polymerization of the aniline. Thus, a core-shell structure is formed. The core-shell structure includes a magnetic/dielectric core and a conductive shell for covering the magnetic/dielectric core.

It is another objective of the present invention to provide a method for making an electromagnetic wave-absorbing composite.

To achieve the foregoing objective, the method includes the step of mixing barium ferrite with barium titanate and dissolving the mixture in water, the step of mixing dodecylbenzenesulfonic acid (DBSA) with aniline, thus providing an emulsifying agent, the step of adding the solution and ammonium persulfade (APS) into the emulsifying agent so that polymerization occurs, the step of adding acetone for dividing the mixture made in the forgoing step into an upper tier and a lower tier, and the step of filtering and drying deposits in the lower tier, thus providing a (Ba Ferrite+$BaTiO_3$)/PANI composite.

It is another objective of the present invention to provide a method for making an infrared-shielding and microwave electromagnetic wave-absorbing composite.

To achieve the foregoing objective, the method includes the step of mixing liquid resin with a (Ba Ferrite+$BaTiO_3$)/PANI composite, the step of stirring the mixture, the step of filling the mixture in a mold, the step of curing and cooling the mixture, thus forming a final product, and the step of removing the final product from the mold. The liquid resin may be epoxy, polyurethane resin, poly-methylmethacrylate, silicone resin or polyester resin.

Other objectives, advantages and features of the present invention will be apparent from the following description referring to the attached drawings.

BRIEF DESCRIPTION OF DRAWINGS

The present invention will be described via detailed illustration of two embodiments referring to the drawings wherein.

DETAILED DESCRIPTION OF EMBODIMENTS

Figure 1:
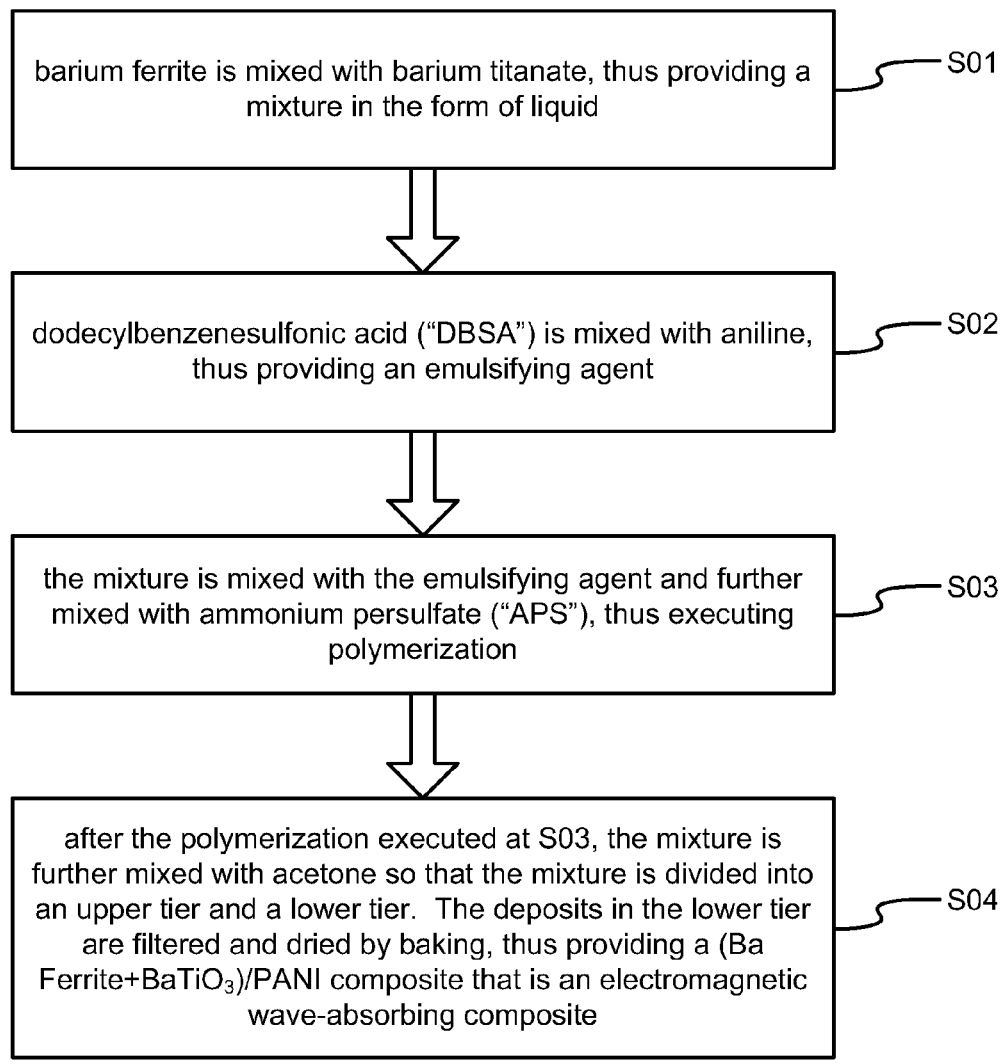
FIG. 1 is a flow chart of a method for making an electromagnetic wave-absorbing composite in accordance with the first embodiment of the present invention.

Referring to FIG. 1, there is shown a method for making an electromagnetic wave-absorbing composite in accordance with a first embodiment of the present invention. At S01, barium ferrite is mixed with barium titanate, thus providing a mixture in the form of liquid.

At S02, dodecylbenzenesulfonic acid ("DBSA") is mixed with aniline, thus providing an emulsifying agent.

At S03, the mixture is mixed with the emulsifying agent and further mixed with ammonium persulfate ("APS"), thus executing polymerization.

At S04, after the polymerization executed at S03, the mixture is further mixed with acetone so that the mixture is divided into an upper tier and a lower tier. The deposits in the lower tier are filtered and dried by baking, thus providing a (Ba Ferrite+BaTiO$_3$)/PANI composite that is an electromagnetic wave-absorbing composite.

Figure 2:
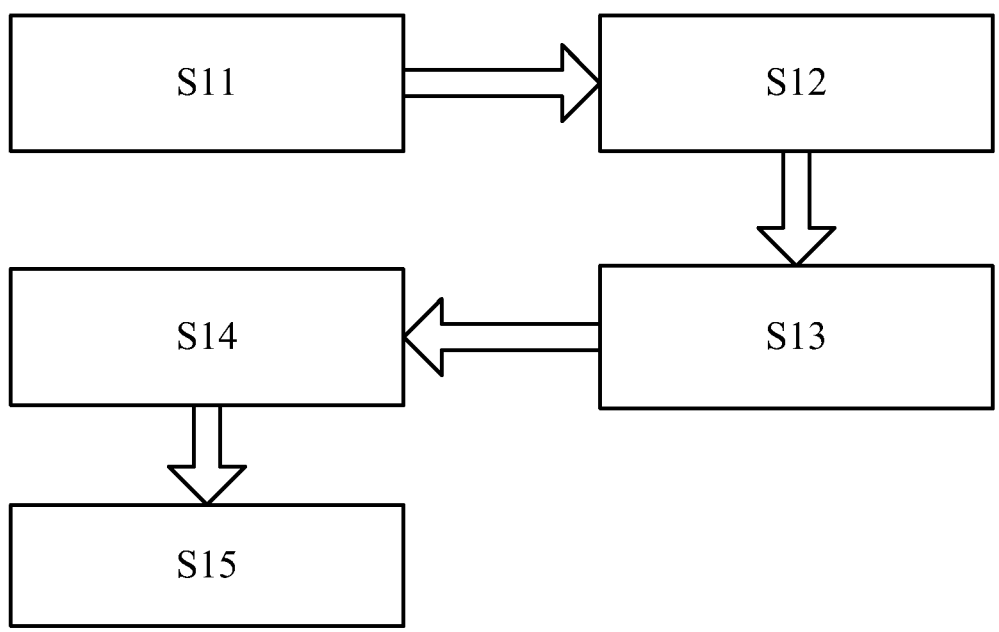
FIG. 2 is a flow chart of a method for making a microwave-absorbing composite in accordance with the second embodiment of the present invention.

Referring to FIG. 2, there is shown a method for making an infrared-shielding and microwave-absorbing composite in accordance with a second embodiment of the present invention.

At S11, barium nitride, iron nitride and glycine are mixed with one another at a mole ratio of 1:11.5:25. The mixture is introduced into a proper amount of de-ionized water and stirred for 15 minutes so that the barium nitride, iron nitride and glycine are dissolved in the de-ionized water. Ammonium hydroxide is introduced into the solution to adjust the pH of the solution to be 7. The solution is subjected to an oil bath at 100° C., thus providing brown collosol. The collosol is baked for 24 hours so that it is turned into gel. The gel is heated and burned on a heating plate, thus providing puffy gray powder. The powder is calcined at 450° C., 650° C., 750° C. and 850° C., each for 3 hours, thus providing blocks of barium ferrite. Then, the blocks are ground to provide barium ferrite ("BaFe$_{12}$O$_{19}$") powder.

At S12, 0.1 mole of tetrabutyl titanate is dissolved in isopropyl alcohol and stirred for 30 minutes. At the room temperature, 0.1 mole of barium acetate is dissolved in the solution. Glacial acetic acid is introduced into the solution to adjust the pH of the solution to be 3.5 to 3.0. The solution is subjected to a sol-gel reaction for a proper period of time. Then, the solution is located in a vacuum dryer at 70° C. for 24 hours and turned into gel. The gel is calcined in a high-temperature oven at 750° C. to 900° C., thus providing barium titanate blocks. The barium titanate blocks are cooled and ground into barium titanate (BaTiO$_3$) powder.

At S13, 5 grams of barium ferrite and 5 grams of barium titanate are introduced into 500 ml of de-ionized water. At the room temperature, the solution is stirred by ultrasonic waves for 1 hour. Then, 0.1 mole of dodecylbenzenesulfonic acid ("DBSA") is introduced into 300 ml of de-ionized water. A blender is used to stir the mixture for 10 minutes before 10 grams of aniline is introduced into the mixture and emulsified for 30 min. The solution containing the mixture of the barium ferrite with the barium titanate is introduced into a premixed DBSA-Aniline emulsifying agent and stirred by ultrasonic waves for 1 hour.

At S14, 0.1 mol of ammonium persulfate is introduced into 200 ml of de-ionized water and stirred for 1 hour and then, within 30 minutes, added into the emulsifying agent. Polymerization is executed at 0° C. to 5° C. for 12 hours. After the polymerization, acetone is added, thus dividing the solution into an upper tier and a lower tier. Deposits in the lower tier are subjected to vacuum filtration and located in an oven operated at 60° C. for 24 hours, thus providing a (Ba Ferrite+BaTiO$_3$)/PANI composite.

At S15, liquid resin is mixed with the (Ba Ferrite+BaTiO3)/PANI compositecomposite at a ratio of 65:35. The liquid resin may be epoxy, polyurethane resin, poly-methyl-methacrylate, silicone resin or polyester resin. The mixture is stirred and filled in a mold in which the mixture is cured and cooled. Then, removed from the mold is an infrared-shielding and microwave electromagnetic wave-absorbing material in the form of a plate about 0.5 to 5.0 millimeters thick. The infrared-shielding and microwave electromagnetic wave-absorbing material exhibits reflection loss of more than 10 dB in a range of 18 to 40 GHz.

Figure 3:
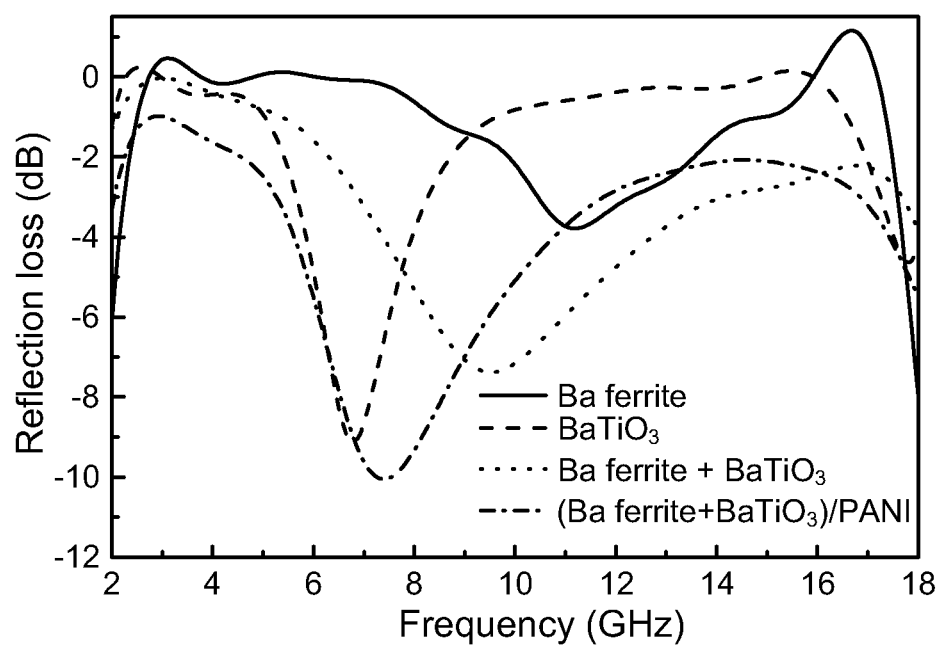
FIG. 3 shows the performance of the microwave-absorbing composite versus several conventional microwave-absorbing materials regarding low-frequency microwaves.
Figure 4:
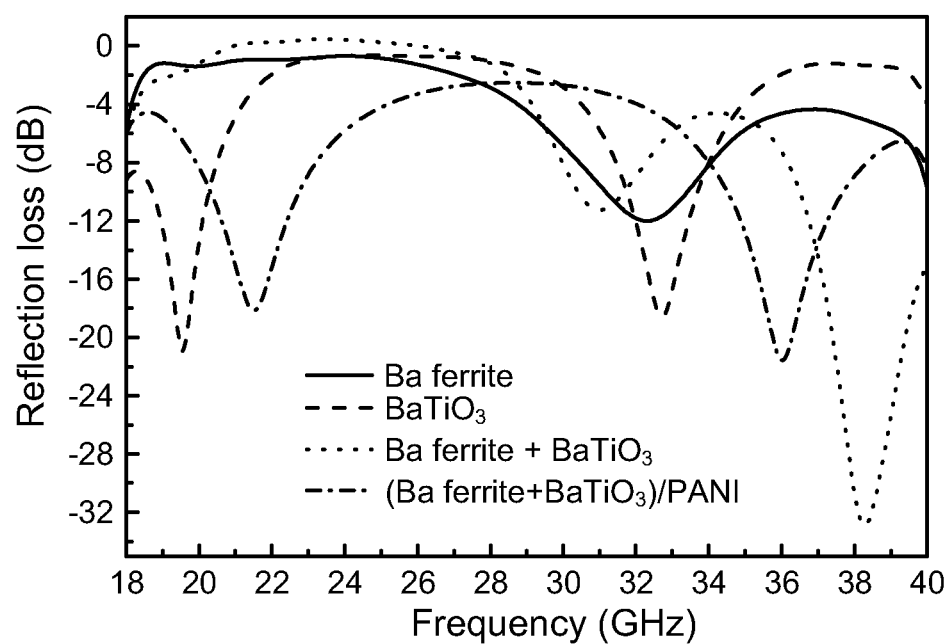
FIG. 4 shows the performance of the microwave-absorbing composite versus several conventional microwave-absorbing materials regarding high-frequency microwaves.

Referring to FIGS. 3 and 4, there is shown the reflection loss of the microwave-absorbing composite of the present invention versus several conventional microwave-absorbing materials. The unit of reflection loss is dB. Frequency represents the frequency of the electromagnetic wave-absorbing material and the unit of frequency is GHz.

Referring to FIG. 3, there is shown the reflection loss of the composite regarding low-frequency microwaves (2-18 GHz). Regarding the low-frequency microwaves, the electromagnetic wave-absorbing materials are tested. BaFe$_{12}$O$_{19}$ exhibits the highest reflection loss (dB=−4) at about 11 GHz. BaTiO$_3$ exhibits the highest reflection loss (dB=−9) at about 6.8 GHz. The (Ba ferrite+BaTiO$_3$) composite exhibits the highest reflection loss (dB=−7.5) at about 9.8 GHz, and the (Ba ferrite+BaTiO$_3$)/PANI composite exhibits the highest reflection loss (dB=−10) at about 7.5 GHz. Obviously, the (Ba ferrite+BaTiO$_3$)/PANI composite exhibits the highest reflection loss.

Referring to FIG. 4, there is shown the reflection loss of the composite regarding high-frequency microwaves (18-40 GHz). The electromagnetic wave-absorbing materials are texted regarding the high-frequency microwaves. BaFe$_{12}$O$_{19}$ exhibits the highest reflection loss (dB=−12) at about 32.5 GHz.

BaTiO$_3$ exhibits two peaks of reflection loss. The first peak appears at about 19.5 GHz wherein dB=−22. The second peak appears at about 32.5 GHz where dB=−19. Where dB=−10, the band width is 1.5 GHz (19-20.5 GHz) or 2 GHz (31.5-33.5 GHz).

The (Ba ferrite+BaTiO$_3$) composite exhibits two peaks of reflection loss. The first peak appears at about 31 GHz where dB=−12. The second peak appears at about 38.2 GHz where dB=−33. Where dB=−10, the bandwidth is 1.5 GHz (30.2-31.7 GHz) or 4 GHz (36-40 GHz).

The (Ba ferrite+BaTiO$_3$)/PANI composite also exhibits two peaks of reflection loss. The first peak appears at 22 GHz where dB=−18. The second peak appears at about 36 GHz where dB=−22. Where dB=−10, the band width is 2.5 GHz (21.3-23.2 GHz) or 4 GHz (34-38 GHz). Obviously, the (Ba ferrite+BaTiO$_3$)/PANI composite exhibits the best electromagnetic wave-absorbing properties at 18 to 40 GHz.

Figure 5:
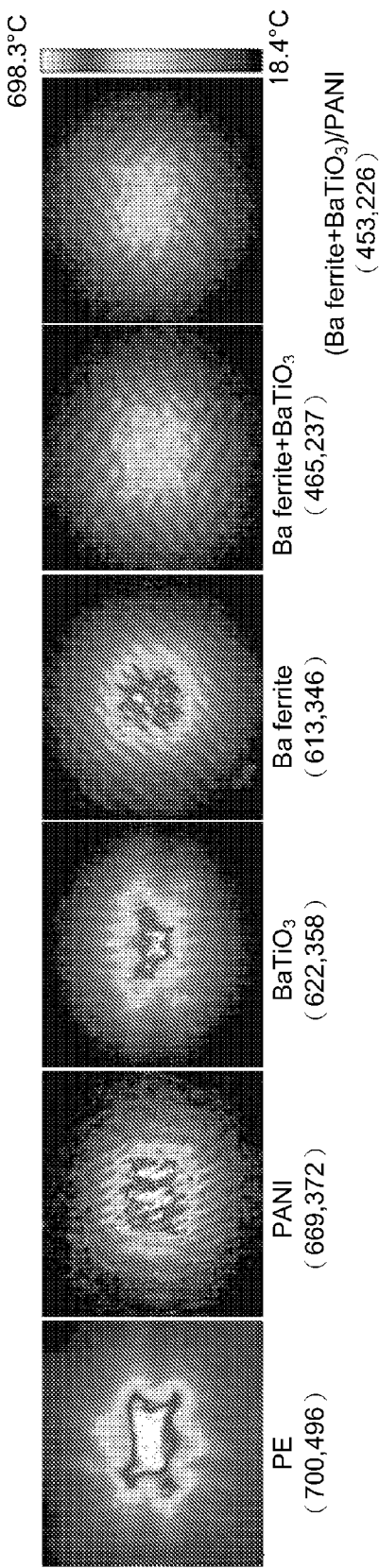
FIG. 5 shows middle infrared thermography photographs of the microwave-absorbing composite versus the conventional microwave-absorbing materials.

Referring to FIG. 5, there are shown middle infrared (3-5 um) thermography photographs of the microwave-absorbing composite of the present invention versus several conventional microwave-absorbing materials. It can be found, the highest temperature of pure PE is 700° C. while the average temperature of pure PE is 496° C. When PE is mixed with a small amount of PANI (0.02 g/cm$^3$), the highest temperature of the mixture is 669° C. while the average temperature of the mixture is 372° C. When PE is mixed with a small amount of BaTiO$_3$, the highest temperature of the mixture is 622° C. while the average temperature of the mixture is 358° C. When PE is mixed with a small amount of BaFe$_{12}$O$_{19}$, the highest temperature of the mixture is 613° C. while the average temperature of the mixture is 346° C. When PE is mixed with a small amount of (Ba ferrite+BaTiO$_3$), the highest temperature of the mixture is 465° C. while the average temperature of the mixture is 237° C. When PE is mixed with a small amount of the (Ba ferrite+BaTiO$_3$)/PANI composite, the highest temperature of the mixture is 453° C. while the average temperature of the mixture is 226° C. The temperature on the surface of the PE film considerably drops as it is mixed with the microwave-absorbing materials. Among them, the addition of the (Ba ferrite+BaTiO$_3$)/PANI composite exhibits the best effect of reducing the average temperature by 260° C.

Figure 6:
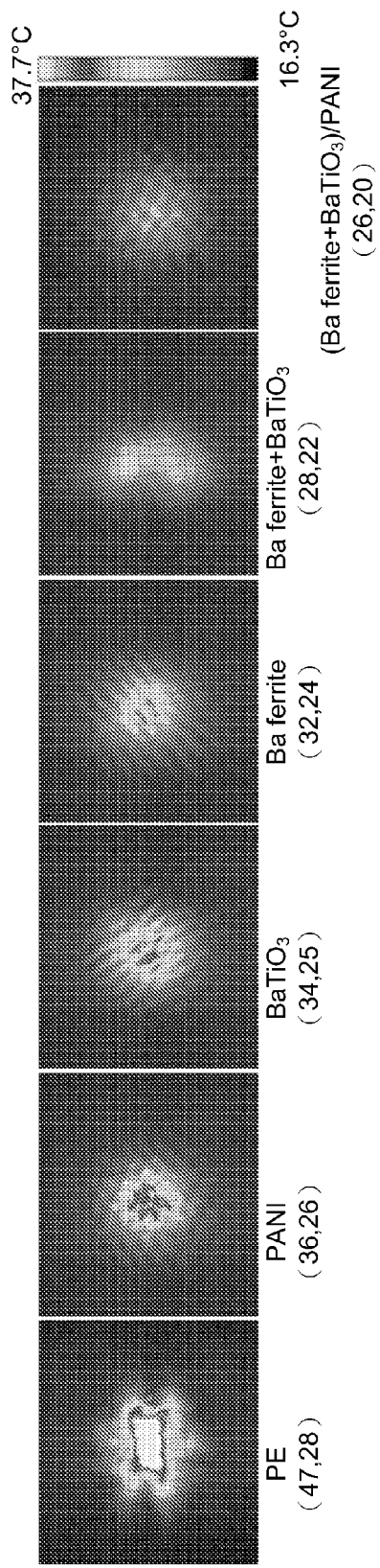
FIG. 6 shows far-end infrared thermography photographs of the microwave-absorbing composite versus the conventional microwave-absorbing materials.

Referring to FIG. 6, there are shown far-end infrared (8-12 um) thermography photographs of the microwave-absorbing composite of the present invention versus the conventional microwave-absorbing materials. FIG. 6 shows similar results as FIG. 5 does. The temperature on the surface of the PE film considerably drops as it is mixed with the microwave-absorbing materials. The addition of the (Ba ferrite+BaTiO$_3$)/PANI composite exhibits the best effect of reducing the average temperature by 260° C. Obviously, the (Ba ferrite+BaTiO$_3$)/PANI composite best reduces the temperature on the surface of the PE film.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. A method for making an electromagnetic wave-absorbing composite, the method including the steps of:

mixing barium nitride, iron nitride and glycine with one another and with deionized water and stirring so that the barium nitride, iron nitride and glycine are dissolved in the de-ionized water;

introducing ammonium hydroxide into the barium nitride-iron nitride-glycine solution to adjust the pH of the solution;

subjecting the barium nitride-iron nitride-glycine solution to a bath so as to form brown collosol;

baking the brown collosol so that it is turned into gel;

heating and calcining the gel to obtain barium ferrite (BaFe$_{12}$O$_{19}$) powder;

dissolving tetrabutyl titanate in isopropyl alcohol and stirring;

dissolving barium acetate in the tetrabutyl titanate-isopropyl alcohol solution;

introducing glacial acetic acid into the barium acetate-tetrabutyl titanate-isopropyl alcohol solution to adjust the pH of the solution;

subjecting the solution to a sol-gel reaction;

drying and calcining obtained gel to obtain barium titanate (BaTiO$_3$) powder;

mixing the barium ferrite with the barium titanate and dissolving the mixture in water;

separately mixing dodecylbenzenesulfonic acid (DBSA) and deionized water and stirring;

then adding aniline to the DBSA and deionized water and emulsifying, thus providing an emulsifying agent;

adding the barium ferrite +barium titanate solution to the pre-mixed DBSA-aniline emulsifying agent and stirring by ultrasonic waves;

adding ammonium persulfate (APS) into de-ionized water and stirring;

adding the APS solution to the barium ferrite + barium titanate and emulsifying agent so that polymerization occurs;

after the polymerization, adding acetone for dividing the mixture made in the forgoing step into an upper tier and a lower tier;

filtering and drying deposits in the lower tier, thus providing a (Ba Ferrite+BaTiO$_3$)/polyaniline composite.

2. A method for making an infrared-shielding and microwave electromagnetic wave-absorbing composite including the steps of:

mixing liquid resin with the Ba Ferrite+BaTiO$_3$/polyaniline composite made in the method as set forth in claim 1;

stirring the mixture;

filling the mixture in a mold;

curing and cooling the mixture, thus forming a final product; and removing the final product from the mold.

3. The method in accordance with claim 2, wherein the liquid resin is selected from the group consisting of polyurethane resin, poly-methylmethacrylate, silicone resin and polyester resin.

4. The method of claim 1, wherein the mixing barium ferrite with barium titanate and dissolving the mixture in water further comprises stirring the solution by ultrasonic waves.

5. The method of claim 1, wherein the barium nitride, iron nitride and glycine are mixed with one another at a mole ratio of 1:11.5:25.

* * * * *